(12) United States Patent
Milota et al.

(10) Patent No.: US 10,996,086 B2
(45) Date of Patent: May 4, 2021

(54) SYSTEM AND METHOD FOR MEMS SENSOR SYSTEM SYNCHRONIZATION

(71) Applicant: INVENSENSE, INC., San Jose, CA (US)

(72) Inventors: Andy Milota, San Ramon, CA (US); James Lim, Saratoga, CA (US); William Kerry Keal, Santa Clara, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 16/724,815

(22) Filed: Dec. 23, 2019

(65) Prior Publication Data
US 2020/0240819 A1 Jul. 30, 2020

Related U.S. Application Data

(63) Continuation of application No. 16/247,543, filed on Jan. 14, 2019, now Pat. No. 10,514,279, which is a continuation of application No. 14/510,224, filed on Oct. 9, 2014, now Pat. No. 10,180,340.

(51) Int. Cl.
*G01D 18/00* (2006.01)
*H03L 1/00* (2006.01)
*H03L 7/00* (2006.01)
*B81B 7/02* (2006.01)

(52) U.S. Cl.
CPC ............ *G01D 18/008* (2013.01); *B81B 7/02* (2013.01); *H03L 1/00* (2013.01); *H03L 7/00* (2013.01); *B81B 2201/0235* (2013.01); *B81B 2201/0242* (2013.01); *B81B 2201/0292* (2013.01); *B81B 2207/09* (2013.01)

(58) Field of Classification Search
CPC .............. G01D 18/008; B81B 7/02; B81B 2201/0235; B81B 2201/0242; B81B 2201/0292; H03L 1/00; H03L 7/00
See application file for complete search history.

(56) References Cited

U.S. PATENT DOCUMENTS

| | | | | |
|---|---|---|---|---|
| 9,423,426 | B1* | 8/2016 | Chelmins | G01R 13/0254 |
| 2009/0259424 | A1* | 10/2009 | Dutta | G01C 25/005 |
| | | | | 702/85 |
| 2011/0215952 | A1* | 9/2011 | Aria | G06F 3/03 |
| | | | | 341/20 |
| 2011/0254760 | A1* | 10/2011 | Lloyd | A63F 13/211 |
| | | | | 345/156 |
| 2013/0219207 | A1* | 8/2013 | Milota | H04W 56/001 |
| | | | | 713/400 |
| 2014/0122958 | A1* | 5/2014 | Greenebrg | A61B 5/112 |
| | | | | 714/748 |
| 2014/0257730 | A1* | 9/2014 | Czompo | G01P 15/08 |
| | | | | 702/89 |
| 2015/0185054 | A1* | 7/2015 | Hesch | G01D 9/005 |
| | | | | 702/187 |

* cited by examiner

*Primary Examiner* — Raymond L Nimox
(74) *Attorney, Agent, or Firm* — Bay Area Technology Law Group PC

(57) ABSTRACT

Various aspects of this disclosure comprise systems and methods for synchronizing sensor data acquisition and/or output. For example, various aspects of this disclosure provide for achieving a desired level of timing accuracy in a MEMS sensor system, even in an implementation in which timer drift is substantial.

18 Claims, 5 Drawing Sheets

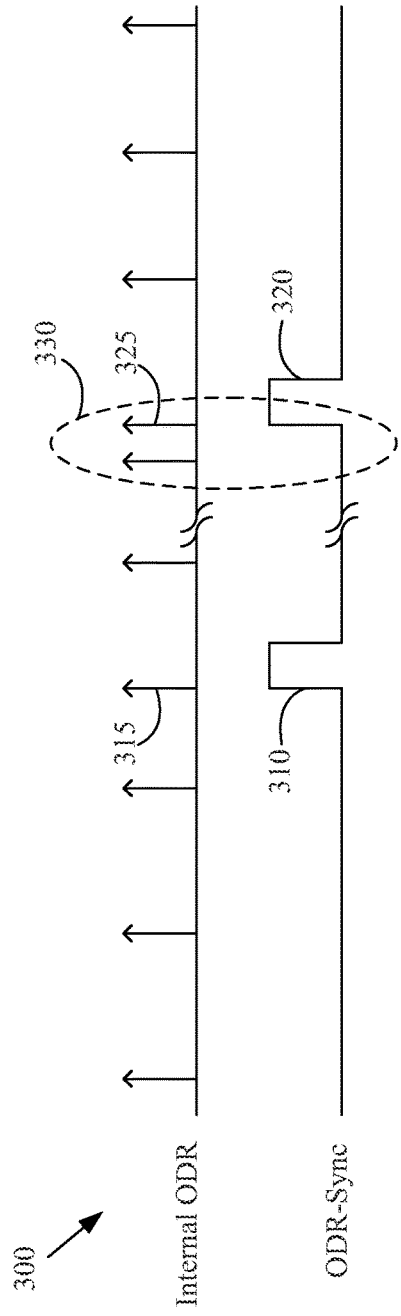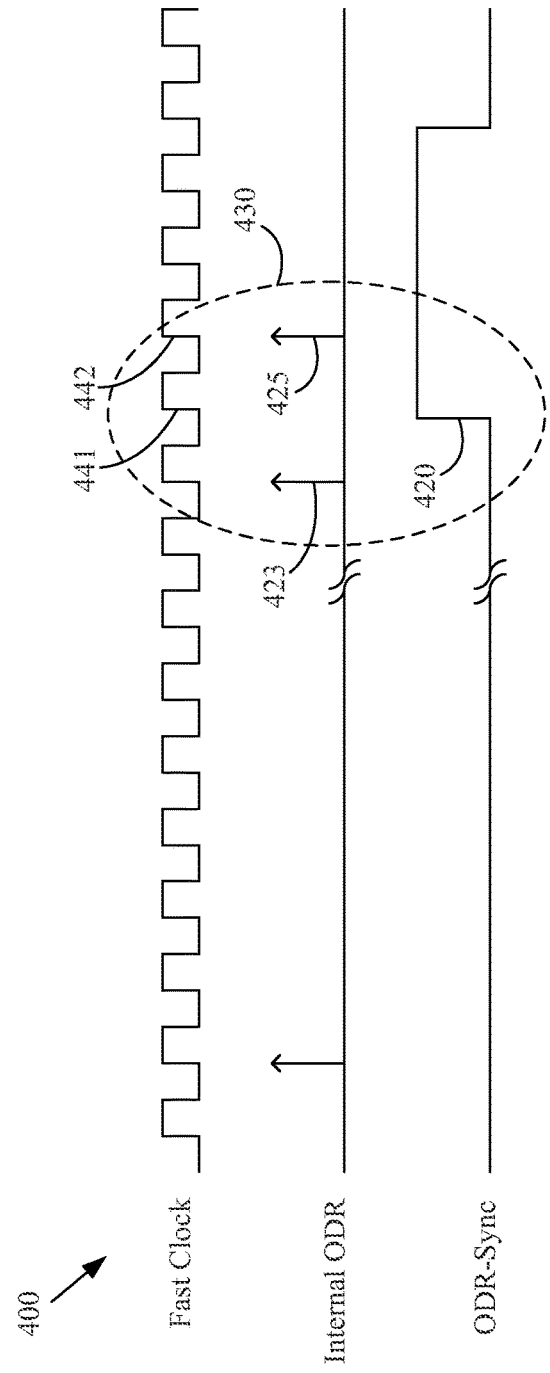

SYSTEM AND METHOD FOR MEMS SENSOR SYSTEM SYNCHRONIZATION

BACKGROUND

Sensor circuits and/or systems may comprise internal timers that are used for sensor sampling. In various example implementations the timers that are used for sensor sampling may comprise inaccuracies, for example timer drift, that present synchronization challenges. Further limitations and disadvantages of conventional and traditional approaches will become apparent to one of skill in the art, through comparison of such approaches with the disclosure as set forth in the remainder of this application with reference to the drawings.

BRIEF DESCRIPTION OF SEVERAL VIEWS OF THE DRAWINGS

FIG. 3 shows a timing diagram of an example synchronization scenario, in accordance with various aspects of the present disclosure.

FIG. 4 shows a timing diagram of an example synchronization scenario, in accordance with various aspects of the present disclosure.

SUMMARY

Figure 1:
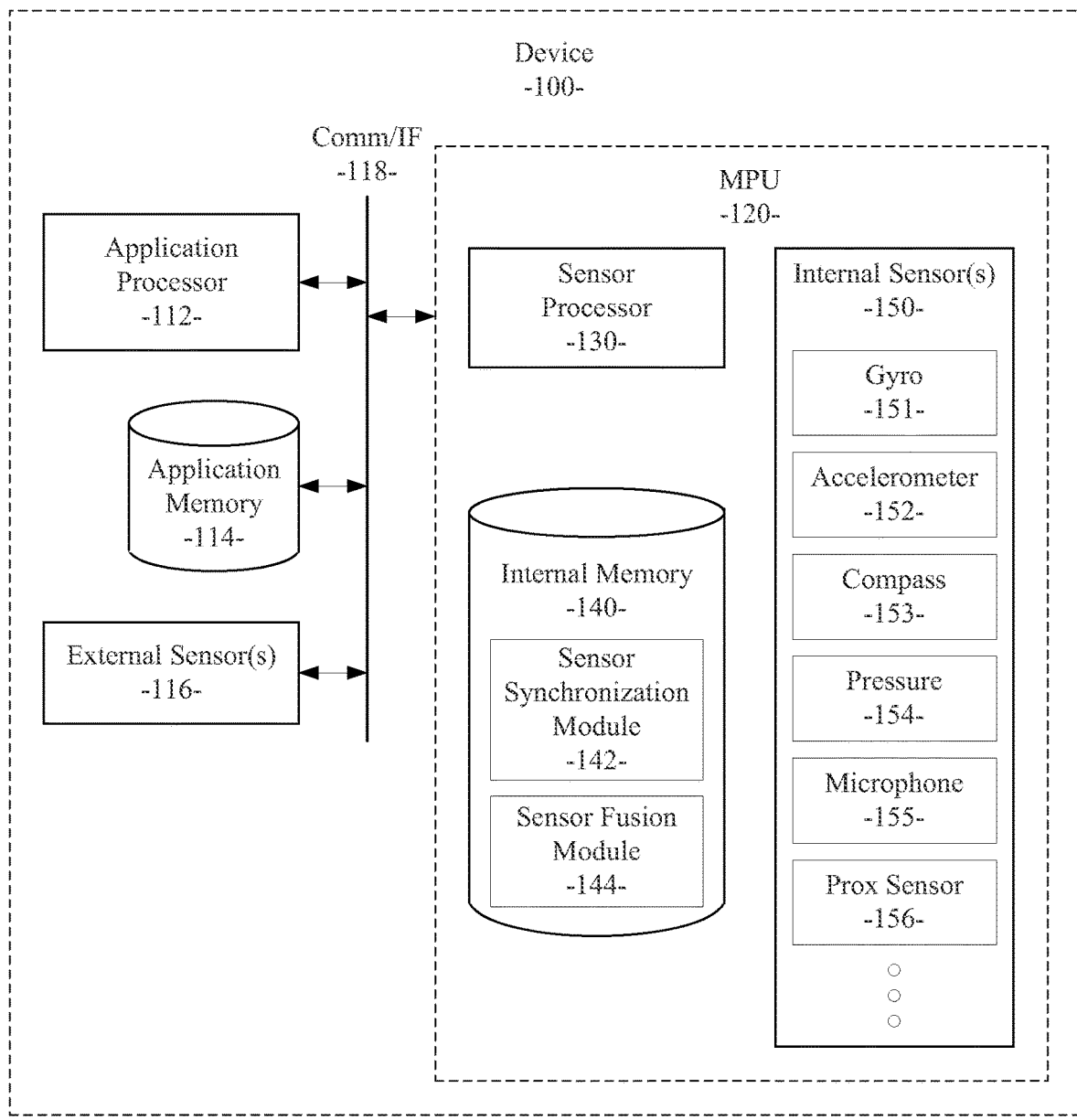
FIG. 1 shows a block diagram of an example electronic device comprising sensor synchronization capability, in accordance with various aspects of the present disclosure.

Various aspects of this disclosure comprise systems and methods for synchronizing sensor data acquisition and/or output. For example, various aspects of this disclosure provide for achieving a desired level of timing accuracy in a MEMS sensor system, even in an implementation in which timer drift is substantial.

DETAILED DESCRIPTION OF VARIOUS ASPECTS OF THE DISCLOSURE

The following discussion presents various aspects of the present disclosure by providing various examples thereof. Such examples are non-limiting, and thus the scope of various aspects of the present disclosure should not necessarily be limited by any particular characteristics of the provided examples. In the following discussion, the phrases "for example" and "e.g." and "exemplary" are non-limiting and are generally synonymous with "by way of example and not limitation," "for example and not limitation," and the like.

The following discussion may at times utilize the phrase "A and/or B." Such phrase should be understood to mean just A, or just B, or both A and B. Similarly, the phrase "A, B, and/or C" should be understood to mean just A, just B, just C, A and B, A and C, B and C, or all of A and B and C.

The following discussion may at times utilize the phrases "operable to," "operates to," and the like in discussing functionality performed by particular hardware, including hardware operating in accordance with software instructions. The phrases "operates to," "is operable to," and the like include "operates when enabled to." For example, a module that operates to perform a particular operation, but only after receiving a signal to enable such operation, is included by the phrases "operates to," "is operable to," and the like.

The following discussion may at times refer to various system or device functional modules. It should be understood that the functional modules were selected for illustrative clarity and not necessarily for providing distinctly separate hardware and/or software modules. For example, any one or more of the modules discussed herein may be implemented by shared hardware, including for example a shared processor. Also for example, any one or more of the modules discussed herein may share software portions, including for example subroutines. Additionally for example, any one or more of the modules discussed herein may be implemented with independent dedicated hardware and/or software. Accordingly, the scope of various aspects of this disclosure should not be limited by arbitrary boundaries between modules unless explicitly claimed. Additionally, it should be understood that when the discussion herein refers to a module performing a function, the discussion is generally referring to either a pure hardware module implementation and/or a processor operating in accordance with software. Such software may, for example, be stored on a non-transitory machine-readable medium.

In various example embodiments discussed herein, a chip is defined to include at least one substrate typically formed from a semiconductor material. A single chip may for example be formed from multiple substrates, where the substrates are mechanically bonded to preserve the functionality. Multiple chip (or multi-chip) includes at least 2 substrates, wherein the 2 substrates are electrically connected, but do not require mechanical bonding.

A package provides electrical connection between the bond pads on the chip (or for example a multi-chip module) to a metal lead that can be soldered to a printed circuit board (or PCB). A package typically comprises a substrate and a cover. An Integrated Circuit (IC) substrate may refer to a silicon substrate with electrical circuits, typically CMOS circuits. A MEMS substrate provides mechanical support for the MEMS structure(s). The MEMS structural layer is attached to the MEMS substrate. The MEMS substrate is also referred to as handle substrate or handle wafer. In some embodiments, the handle substrate serves as a cap to the MEMS structure.

In the described embodiments, an electronic device incorporating a sensor may, for example, employ a motion tracking module also referred to as Motion Processing Unit (MPU) that includes at least one sensor in addition to electronic circuits. The at least one sensor may comprise any of a variety of sensors, such as for example a gyroscope, a compass, a magnetometer, an accelerometer, a microphone, a pressure sensor, a proximity sensor, a moisture sensor, a temperature sensor, a biometric sensor, or an ambient light sensor, among others known in the art.

Some embodiments may, for example, comprise an accelerometer, gyroscope, and magnetometer or other compass technology, which each provide a measurement along three axes that are orthogonal relative to each other, and may be referred to as a 9-axis device. Other embodiments may, for example, comprise an accelerometer, gyroscope, compass, and pressure sensor, and may be referred to as a 10-axis device. Other embodiments may not include all the sensors or may provide measurements along one or more axes.

The sensors may, for example, be formed on a first substrate. Various embodiments may, for example, include solid-state sensors and/or any other type of sensors. The electronic circuits in the MPU may, for example, receive measurement outputs from the one or more sensors. In various embodiments, the electronic circuits process the sensor data. The electronic circuits may, for example, be implemented on a second silicon substrate. In some embodiments, the first substrate may be vertically stacked, attached and electrically connected to the second substrate in a single semiconductor chip, while in other embodiments, the first substrate may be disposed laterally and electrically connected to the second substrate in a single semiconductor package.

In an example embodiment, the first substrate is attached to the second substrate through wafer bonding, as described in commonly owned U.S. Pat. No. 7,104,129, which is hereby incorporated herein by reference in its entirety, to simultaneously provide electrical connections and hermetically seal the MEMS devices. This fabrication technique advantageously enables technology that allows for the design and manufacture of high performance, multi-axis, inertial sensors in a very small and economical package. Integration at the wafer-level minimizes parasitic capacitances, allowing for improved signal-to-noise relative to a discrete solution. Such integration at the wafer-level also enables the incorporation of a rich feature set which minimizes the need for external amplification.

In the described embodiments, raw data refers to measurement outputs from the sensors which are not yet processed. Motion data refers to processed raw data. Processing may, for example, comprise applying a sensor fusion algorithm or applying any other algorithm. In the case of a sensor fusion algorithm, data from one or more sensors may be combined and/or processed to provide an orientation of the device. In the described embodiments, an MPU may include processors, memory, control logic and sensors among structures.

In various device usage scenarios, for example for various applications, the timing at which sensor samples are acquired for one or more sensors may be important. For example, in a scenario in which image stabilization processing is performed, synchronizing the acquisition of gyroscope information with image information acquisition and/or knowing the timing differential may be beneficial. In general, sensor circuits and/or systems may comprise internal timers that are utilized for sensor sampling. Such internal timers may, for example, be characterized by timer inaccuracy (e.g., timer drift) that presents synchronization challenges.

Accordingly, various aspects of this disclosure comprise a system and/or method for synchronizing sensor data acquisition and/or output. For example, various aspects of this disclosure provide a system and method for a host (or other circuit) that sends a synchronization signal to a sensor circuit when the host determines that such a synchronization signal is warranted. Also for example, various aspects of this disclosure provide a system and method by which a sensor circuit that already comprises an internal clock to govern sampling receives a higher-frequency external clock, for example a system clock, that provides for more accurate synchronization. Additionally for example, various aspects of this disclosure provide a system and method that communicates a plurality of synchronization signals to a sensor circuit, which processes the received synchronization signals to determine a timing adjustment to more closely match a desired sensor data acquisition and/or output data rate. Further for example, various aspects of this disclosure provide a system and method that communicates a plurality of synchronization signals to a sensor circuit, which communicates respective internal timer values corresponding to each of the plurality of synchronization signals to a host, which then adjusts timing of the sensor circuit's sensor data acquisition and/or output data rate to more closely match a desired rate.

Turning first to FIG. 1, such figure shows a block diagram of an example electronic device comprising sensor synchronization capability, in accordance with various aspects of the present disclosure. As will be appreciated, the device 100 may be implemented as a device or apparatus, such as a handheld and/or wearable device that can be moved in space by a user and its motion and/or orientation in space therefore sensed. For example, such a handheld device may be a mobile phone (e.g., a cellular phone, a phone running on a local network, or any other telephone handset), wired telephone (e.g., a phone attached by a wire and/or optical tether), personal digital assistant (PDA), pedometer, personal activity and/or health monitoring device, video game player, video game controller, navigation device, mobile internet device (MID), personal navigation device (PND), digital still camera, digital video camera, binoculars, telephoto lens, portable music, video, or media player, remote control, or other handheld device, or a combination of one or more of these devices.

In some embodiments, the device 100 may be a self-contained device that comprises its own display and/or other output devices in addition to input devices as described below. However, in other embodiments, the device 100 may function in conjunction with another portable device or a non-portable device such as a desktop computer, electronic tabletop device, server computer, etc., which can communicate with the device 100, e.g., via network connections. The device 100 may, for example, be capable of communicating via a wired connection using any type of wire-based communication protocol (e.g., serial transmissions, parallel transmissions, packet-based data communications), wireless connection (e.g., electromagnetic radiation, infrared radiation or other wireless technology), or a combination of one or more wired connections and one or more wireless connections.

As shown, the example device 100 comprises an MPU 120, application (or host) processor 112, application (or host) memory 114, and may comprise one or more sensors, such as external sensor(s) 116. The application processor 112 (for example, a host processor) may, for example, be configured to perform the various computations and operations involved with the general function of the device 100 (e.g., running applications, performing operating system functions, performing power management functionality, controlling user interface functionality for the device 100, etc.). The application processor 112 may, for example, be coupled to MPU 120 through a communication interface 118, which may be any suitable bus or interface, such as a peripheral component interconnect express (PCIe) bus, a universal serial bus (USB), a universal asynchronous receiver/transmitter (UART) serial bus, a suitable advanced microcontroller bus architecture (AMBA) interface, an Inter-Integrated Circuit (I2C) bus, a serial digital input output (SDIO) bus, or other equivalent. The application memory 114 may comprise programs, drivers or other data that utilize information provided by the MPU 120. Details regarding example suitable configurations of the application (or host) processor 112 and MPU 120 may be found in co-pending, commonly owned U.S. patent application Ser. No. 12/106,921, filed Apr. 21, 2008, which is hereby incorporated by reference in its entirety.

In this example embodiment, the MPU 120 is shown to comprise a sensor processor 130, internal memory 140 and one or more internal sensors 150. The internal sensors 150 may, for example, comprise a gyroscope 151, an accelerometer 152, a compass 153 (for example a magnetometer), a pressure sensor 154, a microphone 155, a proximity sensor 156, etc.). Though not shown, the internal sensors 150 may comprise any of a variety of sensors, for example, a temperature sensor, light sensor, moisture sensor, biometric sensor, image sensor, etc. The internal sensors 150 may, for example, be implemented as MEMS-based motion sensors, including inertial sensors such as a gyroscope or accelerometer, or an electromagnetic sensor such as a Hall effect or Lorentz field magnetometer. At least a portion of the internal sensors 150 may also, for example, be based on sensor technology other than MEMS technology (e.g., CMOS technology, etc.). As desired, one or more of the internal sensors 150 may be configured to provide raw data output measured along three orthogonal axes or any equivalent structure. The internal memory 114 may store algorithms, routines or other instructions for processing data output by one or more of the internal sensors 150, including the sensor synchronization module 142 and sensor fusion module 144, as described in more detail herein. If provided, external sensor(s) 116 may comprise one or more sensors, such as accelerometers, gyroscopes, magnetometers, pressure sensors, microphones, proximity sensors, image sensors, ambient light sensors, biometric sensors, temperature sensors, and moisture sensors, among other sensors. As used herein, an internal sensor generally refers to a sensor implemented, for example using MEMS techniques, for integration with the MPU 120 into a single chip. Also, an external sensor as used herein generally refers to a sensor carried on-board the device 100 that is not integrated into the MPU 120.

Even though various embodiments may be described herein in the context of internal sensors implemented in the MPU 120, these techniques may be applied to a non-integrated sensor, such as an external sensor 116, and likewise the sensor synchronization module 142 and/or sensor fusion module 144 may be implemented using instructions stored in any available memory resource, such as for example the application memory 114, and may be executed using any available processor, such as the application (or host) processor 112. Still further, the functionality performed by the sensor synchronization module 142 may be implemented using any combination of hardware, firmware and software.

As will be appreciated, the application (or host) processor 112 and/or sensor processor 130 may be one or more microprocessors, central processing units (CPUs), microcontrollers or other processors which run software programs for the device 100 and/or for other applications related to the functionality of the device 100. For example, different software application programs such as menu navigation software, games, camera function control, navigation software, and phone or a wide variety of other software and functional interfaces can be provided. In some embodiments, multiple different applications can be provided on a single device 100, and in some of those embodiments, multiple applications can run simultaneously on the device 100. Multiple layers of software can, for example, be provided on a computer readable medium such as electronic memory or other storage medium such as hard disk, optical disk, flash drive, etc., for use with application processor 112 and sensor processor 130. For example, an operating system layer can be provided for the device 100 to control and manage system resources in real time, enable functions of application software and other layers, and interface application programs with other software and functions of the device 100. In various example embodiments, one or more motion algorithm layers may provide motion algorithms for lower-level processing of raw sensor data provided from internal or external sensors. Further, a sensor device driver layer may provide a software interface to the hardware sensors of the device 100. Some or all of these layers can be provided in the application memory 114 for access by the application processor 112, in internal memory 140 for access by the sensor processor 130, or in any other suitable architecture (e.g., including distributed architectures).

In some example embodiments, it will be recognized that the example architecture depicted in FIG. 1 may provide for sensor synchronization to be performed using the MPU 120 and might not require involvement of the application processor 112 and/or application memory 114. Such example embodiments may, for example, be implemented with one or more internal sensor sensors 150 on a single substrate. Moreover, as will be described below, the sensor synchronization techniques may be implemented using computationally efficient algorithms to reduce processing overhead and power consumption.

As discussed herein, various aspects of this disclosure may, for example, comprise processing various sensor signals indicative of device orientation and/or location. Non-limiting examples of such signals are signals that indicate accelerometer, gyroscope, and/or compass orientation in a world coordinate system.

In an example implementation, an accelerometer, gyroscope, and/or compass circuitry may output a vector indicative of device orientation. Such a vector may, for example, initially be expressed in a body (or device) coordinate system. Such a vector may be processed by a transformation function, for example based on sensor fusion calculations, that transforms the orientation vector to a world coordinate system. Such transformation may, for example, be performed sensor-by-sensor and/or based on an aggregate vector based on signals from a plurality of sensors.

As mentioned herein, the sensor synchronization module 142 or any portion thereof may be implemented by a processor (e.g., the sensor processor 130) operating in accordance with software instructions (e.g., sensor synchronization module software) stored in the internal memory 140), or by a pure hardware solution (e.g., on-board the MPU 120). Also for example, the sensor synchronization module 142 or any portion thereof may be implemented by the application processor 112 (or other processor) operating in accordance with software instructions stored in the application memory 114, or by a pure hardware solution (e.g., on-board the device 100 external to the MPU 120).

The discussion of FIGS. 2-6 will provide further example details of at least the operation of the sensor synchronization module 142. It should be understood that any or all of the functional modules discussed herein may be implemented in a pure hardware implementation and/or by one or more processors operating in accordance with software instructions. It should also be understood that any or all software instructions may be stored in a non-transitory computer-readable medium.

Figure 2:
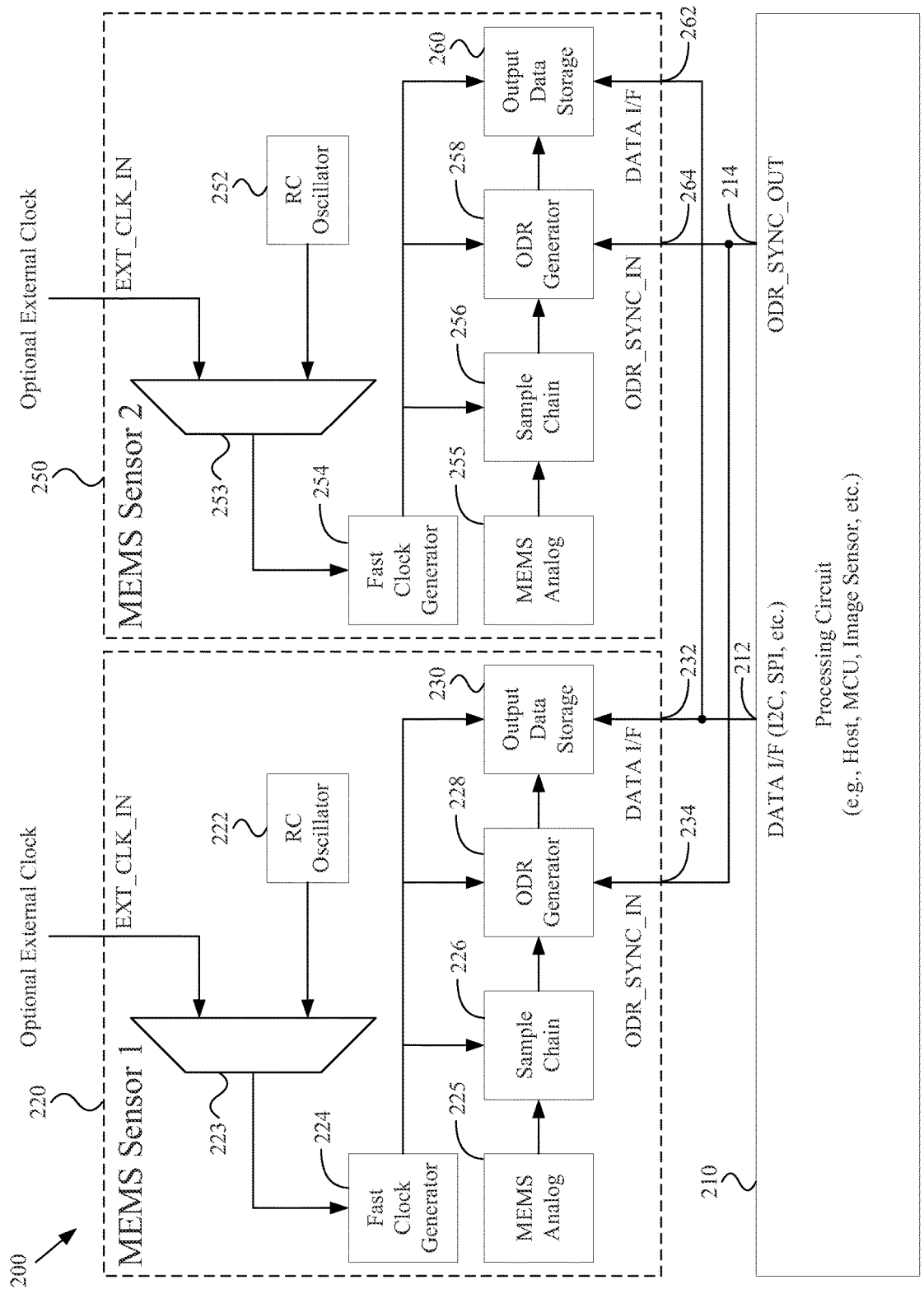
FIG. 2 shows an example sensor system, in accordance with various aspects of the present disclosure.

Turning next to FIG. 2, such figure shows an example sensor system, in accordance with various aspects of the present disclosure. The example sensor system 200 may, for example, be used to synchronize sensors of a handheld device (e.g., a mobile telephone, PDA, camera, portable media player, gaming device, etc.). Note, however, that the sensor system 200 is not limited to handheld devices, for example being readily applicable to wearable devices (e.g., a watch, a headband, an armband, a belt-mounted device, eyeglasses, a fitness device, a health monitoring device, etc.) and other devices. The example sensor system 200 may, for example, share any or all characteristics with the example device 100 illustrated in FIG. 1 and discussed herein. For example, the sensor system 200 or any portion thereof may be implemented with the sensor processor 130 of FIG. 1 operating in accordance with software instructions in the sensor synchronization module 142 stored in the internal memory 140. Also for example, the sensor system 200 or any portion thereof may be implemented with the application (or host) processor 112 operating in accordance with software instructions stored in the application memory 114.

The sensor system 200 may, for example, comprise a processing circuit 210 that utilizes one or more sensor circuits for acquiring various sensed information and/or information derived therefrom. The processing circuit 210 may comprise characteristics of any of a variety of circuit types. For example, the processing circuit 210 may comprise one or more of a host circuit (e.g., an application processor, modem application processor, etc.), a microcontroller unit (e.g., a sensor hub, etc.), a sensor processor, an image sensor or image processor, etc. The processing circuit 210 may, for example, share any or all characteristics with the application processor 112 and/or sensor processor 130 of the example system 100 illustrated in FIG. 1 and discussed herein.

The sensor system 200 may, for example, comprise one or more sensor circuits utilized by the processing circuit 210. Two example sensor circuits 220 and 250 are shown in the example system 200, but the scope of this disclosure is not limited to any particular number of sensor circuits. The sensor circuits 220 and 250 may, for example, comprise one or more MEMS sensors and/or non-MEMS sensors. The sensor circuits 220 and 250 may, for example, share any or all characteristics with the internal sensors 150 and/or external sensors 116 of the system 100 illustrated in FIG. 1 and discussed herein.

One or more of the sensor circuits 220 and 250 may, for example, comprise an integrated circuit in a single electronic package. One or more of the sensor circuits 220 and 250 may, for example, comprise a chip set. Also for example, one or more of the sensor circuits 220 and 250 may comprise a portion of a larger integrated device, for example a system on a chip, a multi-die single-package system, etc.

One or more of the sensor circuits 220 and 250 may, for example, comprise a MEMS gyroscope circuit. Also for example, one or more of the sensor circuits 220 and 250 may comprise an integrated MEMS gyro and accelerometer circuit (e.g., on a same die and/or in a same package). Additionally, for example, one or more of the sensor circuits 220 and 250 may comprise an integrated MEMS gyro, accelerometer, and compass circuit (e.g., on a same die and/or in a same package). Further for example, one or more of the sensor circuits 220 and 250 may comprise an integrated MEMS gyro, accelerometer, compass, and pressure sensor circuit (e.g., on a same die and/or in a same package). Still further for example, one or more of the sensor circuits 220 and 250 may comprise an integrated MEMS gyro, accelerometer, compass, pressure sensor, and microphone circuit (e.g., on a same die and/or in a same package, in different packages, etc.). The one or more sensors 220 and 250 may also comprise biometric sensors, temperature sensors, moisture sensors, light sensors, proximity sensors, etc. (e.g., on a same die and/or in a same package, in different packages, etc.).

A first sensor circuit 220 may, for example, comprise an RC oscillator module 222 that is utilized to generally control the timing of sensing, sensor data processing, and/or data I/O activities of the first sensor circuit 220. The RC oscillator module 222 may, for example, be a relatively low-quality, cheap, and low-power device. For example, the RC oscillator module 222 may be characterized by 10K or more ppm stability. Also for example, the RC oscillator module 222 may be characterized by 5K or more ppm stability, 20K or more ppm stability, 100K or more ppm stability, etc.

The output signal of the RC oscillator module 222 may, for example, be input to a fast clock generator module 224, for example directly or through a multiplexing circuit 223, which provides clock signals to various sensor processing modules of the first sensor circuit 220, for example based on the output of the RC oscillator module 222. For example, the fast clock generator module 224 may provide a clock signal to a sample chain module 226, an output data rate (ODR) generator module 228, an output data storage module 230, etc. The multiplexing circuit 223 may also receive an external clock signal at an external clock input 234. The multiplexing circuit 223 may, for example under the control or the processing circuit 210 and/or the first sensor circuit 220, select whether to provide an external clock signal received at the external clock input 234 or the clock (or timing) signal received from the RC oscillator module 222 to the fast clock generator module 224.

The first sensor circuit 220 may also, for example, comprise a MEMS analog module 225. The MEMS analog module 225 may, for example, comprise the analog portion of a MEMS sensor (e.g., any of the MEMS sensors discussed herein, or other MEMS sensors).

The first sensor circuit 220 may also comprise a sample chain module 226. The sample chain module 226 may, for example, sample one or more analog signals output from the MEMS analog module 225 and convert the samples to one or more respective digital values. In an example implementation, the sample chain module 226 may, for example, comprise a sigma-delta A/D converter that is oversampled and accumulated, for example to output a 16-bit digital value.

The first sensor circuit 220 may additionally, for example, comprise an output data rate (ODR) generator module 228 that, for example, stores digital sensor information from the sample chain module 226 in the output data storage module 230 at an output data rate (ODR).

The first sensor circuit 220 may further, for example, provide a data interface 232, for example at the output of the output data storage module 230 (e.g., a register or bank thereof, a general memory, etc.), via which the processing circuit 210 may communicate with the first sensor circuit 220. For example, the processing circuit 210 may be communicatively coupled to the first sensor circuit 220 via a data bus interface 212 (e.g., an I2C interface, an SPI interface, etc.).

Though the first sensor circuit 220 is illustrated with a single MEMS analog module 225, sample chain module 226, ODR generator module 228, and output data storage module 230, such a single set of modules is presented for illustrative clarity and not for limitation. For example, the first sensor circuit 220 may comprise a plurality of MEMS analog modules, each corresponding to a respective sample chain module, ODR generator module, and/or output data storage module.

Note that the first sensor circuit 220 may also comprise one or more processors that process the sensor information to output information of device location, orientation, etc. For example, the information output to the output data storage module 230 may comprise raw sensor data, motion data, filtered sensor data, sensor data transformed between various coordinate systems, position information, orientation information, timing information, etc.

The first sensor circuit 220 may, for example, comprise a sync signal input 234 that receives a sync signal, for example a pulse, from an external source and aligns the output data rate (ODR) of the first sensor circuit 220 to the received pulse. The pulse may, for example, comprise an ODR_SYNC_IN pulse. The sync signal input 234 may, for example, be coupled to the ODR generator module 228 within the first sensor circuit 220. The sync signal input 234 may, for example, receive a sync signal from the processing circuit 210 (e.g., from a sync signal output 214 of the processing circuit 210).

The second sensor circuit 250 may, for example, share any or all characteristics with the example first sensor circuit 220 discussed herein. For example, as with the first sensor circuit 220, the second sensor circuit 250 may comprise an RC oscillator module 252, multiplexer 253, fast clock generator module 254, MEMS analog module 255, sample chain module 256, ODR generator module 258, output data storage module 260, data interface 262, and sync signal input 264.

FIG. 3 shows a timing diagram 300 of an example synchronization scenario, in accordance with various aspects of the present disclosure. The top time line of the timing diagram 300, labeled "Internal ODR" illustrates the internal output data rate (ODR) of the sensor circuit (e.g., of the first sensor circuit 220, second sensor circuit 250, any sensor circuit discussed herein, a general sensor circuit, etc.). The internal ODR may, for example, be generated by the ODR generator module 228. Though ideally, the ODR may occur at a constant period, in practice the ODR period may drift. For example, as explained herein, an oscillator module (e.g., the RC oscillator modules 222 and 252, or any oscillator module discussed herein) may be constructed with economic efficiency and/or power efficiency taking priority over performance. An example of such oscillator drift may, for example, be seen in the inconsistent time intervals between the internal ODR pulses as shown on the Internal ODR time line of FIG. 3.

The bottom time line of the timing diagram 300, labeled "ODR-Sync" illustrates a sync signal (e.g., the ODR-Sync signal output from the sync signal output 214 of the processing circuit 210, any synchronization signal discussed herein, a general synchronization signal, etc.). As shown in FIG. 3, when the first sync pulse 310 is communicated, for example from the processing circuit 210 to the sensor circuit 220, the internal ODR signal 315 is shifted to align with the first sync pulse 310. At some later time, when the second sync pulse 320 is communicated from the processing circuit 210 to the sensor circuit 220, the internal ODR signal 325 is shifted to align with the second sync pulse. For example, though the ODR generator module 228 would not ordinarily be ready yet to capture and store data from the sample chain module 226, the arrival of the second sync pulse 320 may force the ODR generator module 228 to act. This example synchronization occurrence is labeled 330 and will be referred to elsewhere herein.

As another example, the ODR generator module 228 may generally attempt to operate periodically with a target period of T. At a first time, the ODR generator module 228 acquires first sensor data from the sample chain 226 and stores the acquired first sensor data in the output data storage module 230. Under normal operation, the ODR generator module 228 would then wait until a second time that equals the first time plus the target period of T, and then acquire and store second sensor data. Since, however, the RC oscillator module 222 is imperfect, the operation of the ODR generator module 228 may have fallen behind. Continuing the example, when an ODR sync signal is received, the ODR generator module 228 may respond by immediately acquiring and storing the second sensor data before the ODR generator module 228 would normally have done so (albeit subject to some delay which will be discussed herein).

The synchronization process may be performed as needed. For example, the processing circuit 210 may generate the ODR-Sync signal, outputting such signal at the sync signal output 214, when an application begins executing in which a relatively high degree of synchronization between various sensors is desirable. For example, upon initiation of a camera application, a relatively high degree of synchronization between an image sensor and a gyroscope may be beneficial (e.g., for Optical Image Stabilization (OIS) or Electronic Image Stabilization (EIS) operation). The processing circuit 210 may, for example, generate the ODR-Sync signal when a camera application is initiated (e.g., under the direction of a host operation system, under the direction of the application, etc.). Also for example, the desire for such synchronization may occur during execution of an application, for example when the application is about to perform an activity for which a relatively high degree of synchronization is desirable. For example, when a focus button is triggered for a camera application or a user input is provided to the camera application indicating that the taking of a photo is imminent, the processing circuit 210 may generate the ODR-Sync signal.

The processing circuit 210 may occasionally (e.g., periodically) perform the sync process as needed, for example based on a predetermined re-sync rate. Also for example, the processing circuit 210, having knowledge of the stability (or drift) of the internal ODR signal of the sensor circuit 220 and/or having knowledge of the desired degree of synchronization, may intelligently determine when to generate the ODR-Sync signal. For example, if a worse case drift for the internal ODR signal of the sensor circuit 220 accumulates to an unacceptable degree of misalignment every T amount of time, the processing circuit 210 can output the ODR-Sync signal to the sensor circuit 220 at a period less than T. Such re-synchronization may, for example, occur continually, while a particular application is running, when a user input has been detected that indicates recent or present use of an application in which synchronization is important, when a user input indicates that a function of the system 200 requiring enhanced sensor synchronization is imminent, when use of the host device is detected, etc.

As an example, a time alignment uncertainty may be expressed as:

Uncertainty=(Sensor System ODR ppm/sec drift)/ (ODR-Sync frequency)

Thus, as the ODR-Sync frequency increases, the alignment uncertainty decreases. The energy and processing costs, however, may generally rise with increasing ODR-Sync frequency.

Note that different applications may have different respective synchronization requirements. Thus, first and second applications may cause generation of the ODR-Sync signal at different respective rates. Even within a particular application, the ODR-Sync signal may be generated at different rates (e.g., during normal camera operation versus telephoto operation, during operation with a relatively steady user versus a relatively shaky user where the degree of steadiness can be detected in real time, etc.).

The processing circuit 210 may also, for example, determine when the synchronizing activity is no longer needed. For example, upon a camera or other image acquisition application closing, the processing circuit 210 may determine that the increased (or enhanced) amount of synchronization is no longer necessary. At this point, the sensor circuit 220 timing may revert to the autonomous control of the RC oscillator module 222. Also for example, after a health-related application that determines a user's vital signs finishes performing a heart monitoring activity, the processing circuit 210 may discontinue generating ODR-Sync signals. Further for example, after a photograph has been taken using a camera application and no user input has been received for a threshold amount of time, the camera application may direct the processing circuit 210 (e.g., with software instructions) to discontinue generating ODR-Sync signals. Still further for example, during execution of a navigation application, for example during an indoor navigation and/or other navigation that relies on on-board sensors like inertial sensors, the processing circuit may generate the ODR-Sync signals as needed, but may then, for example, discontinue such generation when GPS-based navigation takes over.

As mentioned herein for example in the discussion of FIG. 2, in accordance with various aspects of this disclosure, the sensor circuit 220 may comprise an external clock input 234 for an external clock signal. In an example configuration, the output from the RC Oscillator Module 222 and the external clock input 234 may both be input to a multiplexer 223, and the desired clock may be selected for utilization by the sensor circuit 220. For example, the sensor circuit 220 may select the external clock signal for utilization whenever present (e.g., with energy detection circuitry coupled to the external clock input 234), the sensor circuit 220 may select the external clock signal for utilization only when directed to do so by the processing circuit 210 (e.g., under the control of an operating system and/or operation specific application being executed by the processing circuit 210), etc. Also for example, the processing circuit 210 may direct the sensor circuit 220 to utilize the external clock signal when the processing circuit 210 is generating ODR-Sync signals.

For example, an external clock signal, for example a system or host clock, may be substantially more accurate than the internal clock of the sensor circuit 220. In such a scenario, utilization of a relatively more accurate external clock for controlling the internal ODR signal may advantageously reduce the rate or frequency at which the processing circuit 210 generates the ODR-Sync signal. In other words, if the sensor circuit 220 internal ODR signal is not drifting as much, it does not need to be re-synchronized as often.

It should be noted that though the above discussion focused on one sensor circuit, the scope of this disclosure is not limited to any particular number of sensor circuits. For example, any number of sensor circuits may be incorporated. In an implementation involving a plurality of sensor circuits, each sensor circuit may have respective synchronization requirements. For example, in such a scenario, all of the sensor circuits may share a synchronization input, which may for example be designed to synchronize the sensor circuit that is in the greatest need of synchronization.

Also for example, in such a scenario each sensor may have a dedicated line (or address on a shared bus) that is used to individually synchronize the sensor in accordance with its own needs. In such a manner, unnecessary synchronization of sensors that are not in need of such synchronization may be avoided. In an example scenario in which a plurality of sensors share a common sync line, the processing circuit 210 may determine an ODR-Sync pulse rate based on a worst case internal ODR drift rate for the sensor circuits. For example, a first sensor circuit may have the highest Internal ODR drift rate. In such a scenario, the processing circuit 210 may determine the ODR-Sync pulse frequency for all of the sensor circuits based on the Internal ODR drift rate of only the first sensor circuit. In another example scenario, the processing circuit 210 may determine an ODR-Sync pulse rate also based on the real time needs of an application currently being executed. For example, if a particular sensor with a worst respective internal ODR drift rate is not being utilized by the current application, then the processing circuit 210 need not consider such processor when determining when to generate the ODR-Sync pulse (e.g., a frequency thereof).

Referring to FIG. 4, such figure shows a timing diagram 400 of an example synchronization scenario, in accordance with various aspects of the present disclosure. The top line, labeled "Fast Clock" illustrates a fast clock signal, such as for example may be output from the fast clock generator module 224. The fast clock signal may, for example, be based on an external clock received at the external clock input 234 of the sensor circuit 220. The middle time line, labeled "Internal ODR" represents the internal ODR signal of the sensor circuit 220. The internal ODR signal may, for example, be synchronized to the fast clock signal. The internal ODR signal may, for example, be the same as the internal ODR signal shown in FIG. 3. The bottom time line, labeled "ODR-Sync" illustrates a sync signal (e.g., the ODR-Sync signal output from the sync signal output 214 of the processing circuit 210). The ODR-Sync signal may, for example, be the same as the ODR-Sync signal shown in FIG. 3.

Though not illustrated in FIG. 3, synchronizing the internal ODR signal to the ODR-Sync signal might take one or more clock cycles. An example of this is illustrated in FIG. 4, for example in the region labeled 430. For example, there may be some delay between the rising edge of the ODR-Sync pulse and the next synchronized internal ODR pulse. For example, after a previous internal ODR event 423 (e.g., a clock event), the processor circuit 210 outputs an ODR-Sync signal 425 from the sync signal output 214 to the sensor circuit 220. The sensor circuit 220 may, for example, notice or clock in the ODR-Sync pulse at rising edge 441 of the Fast Clock. The next internal ODR event 425 (e.g., a clock event, sensor data storage event, etc.) may then occur at the next rising edge 442 of the Fast Clock. Note that the one or more cycles of the Fast Clock may be necessary before generation of the next internal ODR event 425, depending on the particular implementation.

In general, the faster (or higher frequency) that the fast clock signal is, the closer in time the synchronized internal ODR pulse will be to the rising edge of the ODR-Sync pulse. For example, the rate of the fast clock signal may be specified to result in less than some maximum acceptable delay (e.g., 1 ms, 1 us, less than 1 us, etc.).

Figure 5:
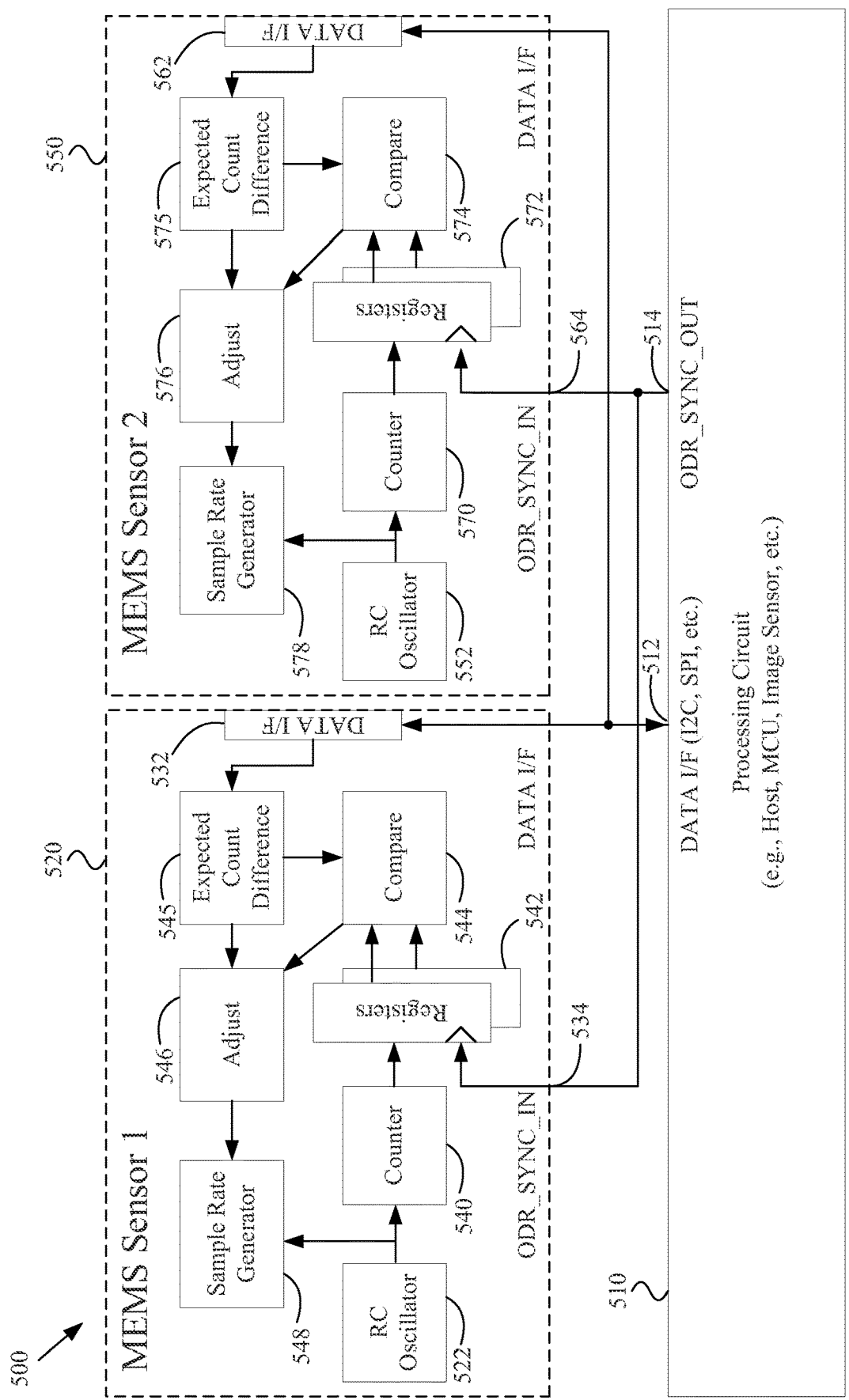
FIG. 5 shows an example sensor system, in accordance with various aspects of the present disclosure.

Referring now to FIG. 5, shows an example sensor system 500, in accordance with various aspects of the present disclosure. The example sensor system 500 may, for example, share any or all characteristics with the example systems 100 and 200 shown in FIGS. 1 and 2 and discussed herein, and all sensor systems discussed herein. For example, the aspects of the example sensor system 500 shown in FIG. 5 may be readily incorporated into the systems 100 and 200 shown in FIGS. 1 and 2, and/or any system discussed herein, and vice versa. Note that, for illustrative clarity, various modules of other systems discussed herein are not shown in the diagram illustrated in FIG. 5 (e.g., the MEMS analog module 225, sample chain module 226, output data storage module 230, etc.).

The components of the sensor system 500 shown in FIG. 5 may share any or all characteristics with similarly-named components of FIGS. 1 and 2. For example, the processing circuit 510 of FIG. 5 may share any or all characteristics with the processing circuitry of FIG. 1 (e.g., the application processor 112 and/or sensor processor 130), the processing circuit 210 of FIG. 2, any processing circuit discussed herein, etc. Also for example, the first and second sensor circuits 520 and 550 of FIG. 5 may share any or all characteristics with the sensor circuits 116 and 150 of FIG. 1, the first and second sensor circuits 220 and 250 of FIG. 2, any sensor circuit discussed herein, etc.

In general, the processing circuit 510 may generate a series of sync pulses (e.g., ODR-Sync pulses) at an accurate and consistent frequency and/or period that is known by the first sensor circuit 520, which are then communicated to the first sensor circuit 520 (e.g., output at the sync signal output 514). The first sensor circuit 520 may then compare its internal clock frequency to that of the known ODR-Sync frequency. Once the first sensor circuit 520 knows the error associated with its internal clock, the first sensor circuit 520 can then adjust its internal timing (e.g., by scaling the internal clock to its desired frequency, by scaling the divide value used to create the ODR, etc.) such that it more accurately matches the desired ODR. This process may be performed with one or more sensor circuits, for example independently.

For example, the output of the RC oscillator module 522 may be provided to a counter module 540. In an example scenario, upon arrival of a first ODR-Sync pulse from the processing circuit 510, the value of a counter may be stored in a first register of a register bank 542. Continuing the example scenario, upon arrival of a second ODR-Sync pulse from the processing circuit 510, the value of the counter may be stored in a second register of the register bank 542. The compare module 544 may then compare the difference between the first and second stored counter values to an expected count difference value, for example received from the expected count difference module 545, that would have resulted had the RC oscillator module 522 been operating ideally. The results of the comparison may then be output to the adjust module 546.

The adjust module 546 may then, for example, determine an adjustment, for example to a clock frequency and/or a clock divide-by value, to achieve a desired internal timing adjustment (e.g., of the Internal ODR signal) for the first sensor circuit 520. The adjust module 546 may then communicate information of the determined adjustment to the sample rate generator module 548. Note that information of the ODR-Sync pulse spacing and/or expected count difference value may be communicated to the first sensor circuit 520 via the data interface 512 of the processing circuit 510 and via the data interface 532 of the first sensor circuit 520. Such information may also, for example, comprise frequency information.

In an example scenario, if the ideal difference between the counters should have been 100, but was only 99, then such a discrepancy could be corrected, for example by changing a clock divide-by value, changing a value of a variable resistor and/or variable capacitor in a timer circuit, etc.

As discussed above with regard to the example system 200 illustrated in FIG. 2, the processing circuit 510 may determine when to perform the synchronization discussed herein and, for example, communicate to the sensor circuits 520 and 550 whether to perform the synchronization. Also for example, the sensor circuits 520 and 550 may also determine whether to perform the synchronization. As discussed herein, intelligently determining when to perform enhanced synchronization, for example different from normal operation, may beneficially save energy by eliminating unnecessary communication and/or processing.

Figure 6:
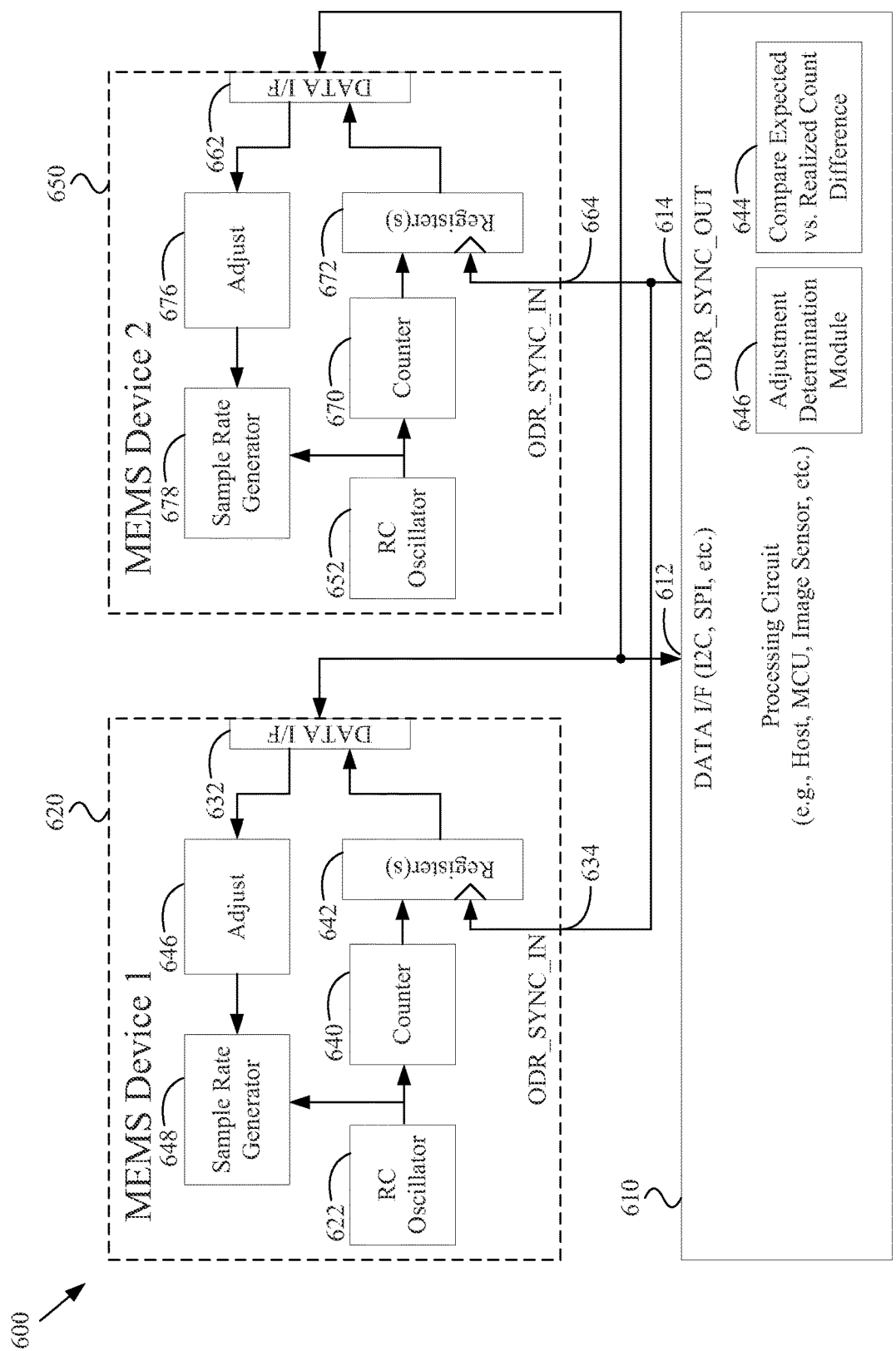
FIG. 6 shows an example sensor system, in accordance with various aspects of the present disclosure.

Referring now to FIG. 6, such figure shows an example sensor system 600, in accordance with various aspects of the present disclosure. The example sensor system 600 in FIG. 6 may, for example, share any or all characteristics with the example systems 100, 200, and 500 shown in FIGS. 1, 2, and 5, and discussed herein. For example, the aspects of the example sensor system 600 shown in FIG. 6 may be readily incorporated into the systems 100, 200, and 500 shown in FIGS. 1, 2, and 5, and vice versa. Note that, for illustrative clarity, various modules of other systems discussed herein are not shown in the diagram illustrated in FIG. 5 (e.g., the MEMS analog module 225, sample chain module 226, output data storage module 230, etc.).

The components of the sensor system 600 shown in FIG. 6 may share any or all characteristics with similarly-named components 100, 200, and 500 of FIGS. 1, 2 and 5. For example, the processing circuit 610 of FIG. 6 may share any or all characteristics with the processing circuitry of FIG. 1 (e.g., the application processor 112 and/or sensor processor 130), of FIG. 1, the processing circuit 210 of FIG. 2, and the processing circuit 510 of FIG. 5, any processing circuit discussed herein, etc. Also for example, the first and second sensor circuits 620 and 650 of FIG. 6 may share any or all characteristics with the sensor circuits 116 and/or 150 of FIG. 1, the first and second sensor circuits 220 and 250 of FIG. 2, the first and second sensor circuits 520 and 550 of FIG. 5, any sensor circuit discussed herein, etc.

The sensor system 600 shown in FIG. 6 may, for example, generally differ from the sensor system 500 shown in FIG. 5 in that the processing circuit 610 plays a relatively more prominent role in adjusting the internal clock rate of the sensor circuits 620 and 650.

In general, the processing circuit 610 may generate two or more ODR-Sync pulses spaced sufficiently enough apart so that the processing circuit 610 can read an internal register 642 in the sensor circuit 620, for example via the data interface 632, between each of the pulses. The processing circuit 610 may, for example, output such ODR-Sync pulses from the sync signal output 614. For example, each ODR-Sync pulse may cause the sensor circuit 620 to capture its own internal timer value in a register 642 accessible to the processing circuit 610 via the data interface 632. Knowing the period of time between each of the pulses sent to the sensor circuit 620 and the corresponding stored (e.g., latched) internal timer counts, the processing circuit 610 may then estimate the clock error of the sensor circuit 620. The processing circuit 610 may then use this error estimate to program the sensor circuit ODR so that it is more in line with the desired rate. This process may be performed with one or more sensor circuits (e.g., first sensor circuit 620, second sensor circuit 650, etc.), for example independently.

In an example scenario, if the desired ODR of the sensor circuit 620 is 100 Hz, and the estimated clock error is +1%, the processing circuit 620 may program the ODR for the sensor circuit 620 to 99 Hz to give the sensor circuit 620 an effective ODR of or near 100 Hz. This estimation process may be repeated on a scheduled basis or when operational conditions warrant (e.g., based on temperature and/or other operational parameters of the sensor circuit 620 changing by more than a specified threshold).

For example, the output of the RC oscillator module 622 may be provided to a counter module 640. Upon arrival of a first ODR-Sync pulse from the processing circuit 610 (e.g., at the sync signal input 634), a first counter value of the counter module 640 may be stored in a register 642. Before generation of a second ODR-Sync pulse, the processing circuit 610 may read the stored first counter value from the register 642, for example via the data interface 632 of the sensor circuit 620 and the data interface 612 of the processing circuit 610. Upon arrival of the second ODR-Sync pulse from the processing circuit 610, a second counter value of the counter module 640 may be stored in the register 642 (or, for example, a second register in a scenario in which both counters are read out after both ODS-Sync pulses have been generated). The compare module 644 of the processing circuit 644 may then compare the difference between the first and second counter values to an expected difference value that would have resulted had the RC oscillator module 622 been operating ideally. The adjustment determination module 646 of the processing circuit 610 may then, for example, determine an adjustment to, for example, a clock frequency and/or a divide-by value of the sensor circuit 220 to achieve a desired internal timing adjustment (e.g., of the Internal ODR signal) for the sensor circuit 220. The adjustment determination module 646 of the processing circuit 610 may then communicate information of the desired timing adjustment (e.g., an adjustment in a requested ODR) to the adjust module 646 of the sensor circuit 620 via the data interface 632 of the sensor circuit 620 (e.g., via a data bus, for example an I2C or SPI bus).

The example sensor systems discussed herein, for example, comprise a sensor circuit 620 with a sync signal input 634. It should be noted that the sync signal input 634 may be implemented on a shared integrated circuit pin, for example an integrated circuit pin that may be utilized for a plurality of different sync signals. For example, a single integrated circuit pin may be configurable to receive an ODR_SYNC_IN input signal and/or an F-SYNC input signal. For example, in system in which it is desired to utilize the example ODR_SYNC_IN-based functionality discussed herein, the sensor circuit 620 may be programmed, for example at system initialization and/or at system construction, to utilize the shared pin as the ODR_SYNC_IN pin. Also for example, in a system in which it is desired to utilize legacy F-SYNC-based synchronization, the sensor circuit 620 may be programmed to utilize the shared pin as an F-SYNC pin. Such a system may, for example, tag the next sample following receipt of an F-SYNC signal.

The example systems 100, 200, 500, and 600 illustrated in FIGS. 1, 2, 5, and 6, and discussed herein, were presented to illustrate various aspects of the disclosure. Any of the systems presented herein may share any or all characteristics with any of the other systems presented herein. Additionally, it should be understood that the various modules were separated out for the purpose of illustrative clarity, and that the scope of various aspects of this disclosure should not be limited by arbitrary boundaries between modules. For example, any one or more of the modules may share hardware and/or software with any one or more other modules.

As discussed herein, any one or more of the modules and/or functions discussed herein may be implemented by a pure hardware solution or by a processor (e.g., an application or host processor, a sensor processor, etc.) executing software instructions. Similarly, other embodiments may comprise or provide a non-transitory computer readable medium and/or storage medium, and/or a non-transitory machine readable medium and/or storage medium, having stored thereon, a machine code and/or a computer program having at least one code section executable by a machine and/or a computer (or processor), thereby causing the machine and/or computer to perform the methods as described herein.

In summary, various aspects of the present disclosure provide a system and method for synchronizing sensor data acquisition and/or output. While the foregoing has been described with reference to certain aspects and embodiments, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular embodiment(s) disclosed, but that the disclosure will include all embodiments falling within the scope of the appended claims.

What is claimed is:

1. A processing circuit configured to receive information from a sensor having an adjustable sensor output data rate (ODR), comprising at least one processor configured to:
   deliver a first sync signal to the sensor;
   deliver a second sync signal to the sensor;
   determine, based at least in part on a sensor sync clock, a time differential between the first sync signal and the second sync signal;
   determine an adjustment to the ODR based, at least in part, on the determined time differential; and
   modify operation of the sensor by applying the determined adjustment to the ODR, wherein the sensor is configured to output measurements at the ODR as established by the sensor sync clock so that subsequent sensor measurements are provided at the adjusted ODR.

2. The processing circuit of claim 1, wherein at least one period of the adjusted ODR corresponds to the determined time differential.

3. The processing circuit of claim 1, wherein the adjusted ODR aligns output measurements from the sensor with sync signals delivered by the processing circuit.

4. The processing circuit of claim 3, wherein a delay between delivery of a sync signal from the processing circuit and the output of a measurement is a predetermined number of sensor sync clock signal cycles.

5. The processing circuit of claim 1, wherein the adjustment to the ODR comprises an adjustment to the sensor sync clock based on the determined time differential.

6. The processing circuit of claim 5, wherein a frequency of the sensor sync clock and/or a divide-by value is modified based, at least in part, on the adjustment to the sensor sync clock.

7. The processing circuit of claim 1, wherein the processor is operable to:
   receive a first counter value from the sensor triggered by delivery of the first sync signal;
   receive a second counter value from the sensor triggered by delivery of the second sync signal; and
   determine the time differential between the first sync signal and the received second sync signal based, at least in part, on a difference between the first and second stored counter values.

8. The processing circuit of claim 1, wherein the processor is operable to transmit information about an expected time differential to the sensor.

9. The processing circuit of claim 8, wherein the expected time differential is determined by the processing circuit.

10. The processing circuit of claim 1, wherein the processing circuit provides the first and second sync signals when an application is initiated.

11. The processing circuit of claim 1, wherein the first and second sync signals are generated upon a determination that enhanced sensor synchronization is desired.

12. The processing circuit of claim 1, wherein the first and second sync signals are generated for image stabilization.

13. The processing circuit of claim 1, wherein the processing circuit is further configured to receive input measurements from at least one additional sensor and adjusts an ODR for the at least one additional sensor.

14. The processing circuit of claim 1, wherein the sensor is a motion sensor.

15. A method for adjusting a sensor output data rate (ODR), wherein measurements from a sensor are output at an ODR established by an internal sensor sync clock of the sensor and received by a processing circuit, comprising:
  delivering a first sync signal from the processing circuit;
  delivering a second sync signal from the processing circuit;
  determining, based at least in part on the internal sensor sync clock, a time differential between the first sync signal and the second sync signal;
  determining an adjustment to the ODR with the processing circuit based, at least in part, on the determined time differential; and
  modifying operation of the sensor by applying the determined adjustment to the ODR, so that subsequent sensor measurements are provided at the adjusted ODR.

16. The method of claim 15, wherein at least one period of the adjusted ODR corresponds to the determined time differential.

17. The method of claim 15, wherein the adjusted ODR aligns output measurements from the sensor with sync signals expected from the processing circuit.

18. A portable device comprising:
  a sensor having an adjustable sensor output data rate (ODR), wherein the sensor has a sensor sync clock, is configured to output measurements at an ODR established by the sensor sync clock; and
  a processing circuit having a sync signal generator and at least one processor configured to:
    deliver a first sync signal to the sensor;
    deliver a second sync signal from the external source;
    determine, based at least in part on the sync clock of the sensor, a time differential between the first sync signal and the second sync signal;
    determine an adjustment to the ODR based, at least in part, on the determined time differential; and
    modify operation of the sensor by applying the determined adjustment to the ODR, wherein the sensor is configured to output measurements at the ODR as established by the sensor sync clock so that subsequent sensor measurements are provided at the adjusted ODR.

* * * * *